United States Patent
Tateyama

(10) Patent No.: US 9,991,130 B2
(45) Date of Patent: Jun. 5, 2018

(54) METHOD FOR MANUFACTURING SEMICONDUCTOR DEVICE

(71) Applicant: Renesas Electronics Corporation, Tokyo (JP)

(72) Inventor: Katsuro Tateyama, Hitachinaka (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days. days.

(21) Appl. No.: 15/683,058

(22) Filed: Aug. 22, 2017

(65) Prior Publication Data

US 2018/0061652 A1    Mar. 1, 2018

(30) Foreign Application Priority Data

Aug. 24, 2016   (JP) ................. 2016-163640

(51) Int. Cl.

| | |
|---|---|
| H01L 21/3205 | (2006.01) |
| H01L 21/3065 | (2006.01) |
| H01L 21/02 | (2006.01) |
| H01L 21/308 | (2006.01) |
| H01L 21/3213 | (2006.01) |
| H01L 29/40 | (2006.01) |
| H01L 29/423 | (2006.01) |
| H01L 29/66 | (2006.01) |
| H01L 21/768 | (2006.01) |
| H01L 29/78 | (2006.01) |

(Continued)

(52) U.S. Cl.
CPC .... *H01L 21/3065* (2013.01); *H01L 21/02049* (2013.01); *H01L 21/308* (2013.01); *H01L 21/32135* (2013.01); *H01L 29/401* (2013.01); *H01L 29/4236* (2013.01); *H01L 21/76805* (2013.01); *H01L 21/76843* (2013.01); *H01L 21/76895* (2013.01); *H01L 23/535* (2013.01); *H01L 23/53266* (2013.01); *H01L 29/66734* (2013.01); *H01L 29/7813* (2013.01)

(58) Field of Classification Search
USPC .......................................................... 438/659
See application file for complete search history.

(56) References Cited

U.S. PATENT DOCUMENTS

| | | |
|---|---|---|
| 2002/0115276 A1 | 8/2002 | Yoshida et al. |
| 2007/0184657 A1 | 8/2007 | Iijima et al. |
| 2013/0001677 A1 | 1/2013 | Okaji |

FOREIGN PATENT DOCUMENTS

| | | |
|---|---|---|
| JP | 2001-237218 A | 8/2001 |
| JP | 2007-214299 A | 8/2007 |
| JP | 2013-012530 A | 1/2013 |

*Primary Examiner* — Timor Karimy
(74) *Attorney, Agent, or Firm* — Sughrue Mion, PLLC

(57) ABSTRACT

A trench is formed at an exposed portion of a semiconductor substrate by performing a dry etching process with a hard mask of silicon oxide film serving as an etching mask in a dry etching device. At this time, a mixed gas of tetrafluoromethane ($CF_4$), a hydrogen bromide gas (HBr), and a chlorine gas ($Cl_2$) is used as an etching gas. The dry etching process is performed under the condition that a flow rate ratio is more than 0 and less than 0.04, the flow rate ratio being a value obtained by dividing a flow rate NF by a flow rate TF, the flow rate NF being a flow rate obtained by dividing a flow rate of the tetrafluoromethane by the number of fluorine atoms bonded to one molecule of the tetrafluoromethane, the flow rate TF being a total flow rate of the hydrogen bromide gas and the chlorine gas.

11 Claims, 7 Drawing Sheets

(51) Int. Cl.
*H01L 23/532* (2006.01)
*H01L 23/535* (2006.01)

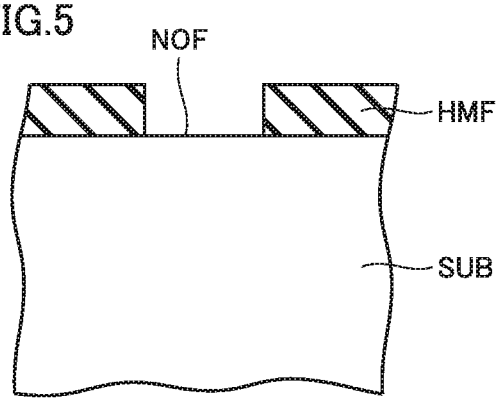
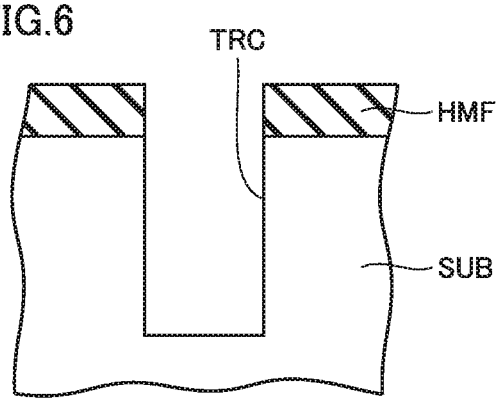

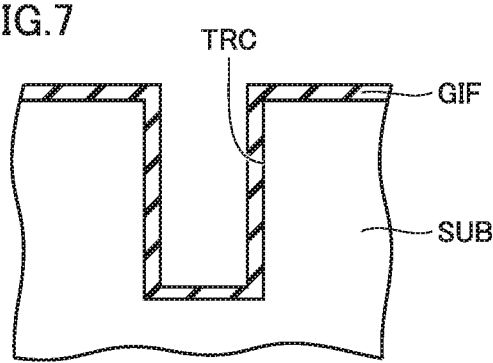
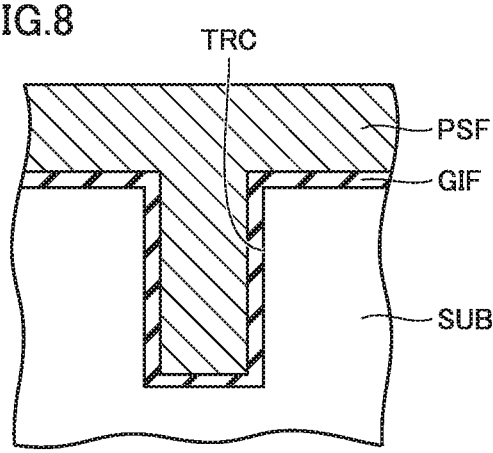

US 9,991,130 B2

METHOD FOR MANUFACTURING SEMICONDUCTOR DEVICE

This nonprovisional application is based on Japanese Patent Application No. 2016-163640 filed on Aug. 24, 2016 with the Japan Patent Office, the entire contents of which are hereby incorporated by reference.

BACKGROUND OF THE INVENTION

Field of the Invention

The present invention relates to a method for manufacturing a semiconductor device and is suitably applicable to, for example, a method for manufacturing a semiconductor device including forming a trench in a semiconductor substrate.

Description of the Background Art

One of power MOS (metal oxide semiconductor) semiconductor devices is a trench-gate semiconductor device where a gate electrode is formed in a trench. In such a type of semiconductor device, a trench having a predetermined depth is formed in a semiconductor substrate, and a gate electrode is formed in the trench with a gate insulating film intervening. One example of patent documents that disclose trench-gate semiconductor devices is Patent Document 1 (Japanese Patent Laying-Open No. 2013-12530).

Patent Document 2 (Japanese Patent Laying-Open No. 2007-214299) and Patent Document 3 (Japanese Patent Laying-Open No. 2001-237218) disclose a method for forming a gate electrode by etching a polysilicon film. As a method for this, a method is proposed that uses a mixed gas containing a chlorine gas ($Cl_2$), a hydrogen bromide gas (HBr), and a fluorine-based gas ($CF_4$, $CHF_3$) for etching a polysilicon film. Further, Patent Document 2 proposes a method where a ratio of flow rate of hydrogen bromide gas to flow rate of chlorine gas ($HBr/Cl_2$) is set to 1.2 or more, and where a ratio of flow rate of fluorine-based gas to flow rate of hydrogen bromide gas (fluorine-based gas/HBr) is set to 1.0 or more.

SUMMARY OF THE INVENTION

For forming a trench having a predetermined depth in a semiconductor substrate, a plasma etching process using a halogen family gas has been widely used conventionally. In particular, a mixed gas of chlorine ($Cl_2$) and hydrogen bromide (HBr) has been used as an etching gas.

However, when a plasma etching process is performed on a semiconductor substrate (silicon substrate) with such a mixed gas, a silicon chloride and a silicon bromide are generated as a reaction product. A silicon chloride and a silicon bromide, which have relatively high freezing points, easily remain in a dry etching device and adhere to and accumulate on the inner wall surface of a chamber as foreign substances.

A method for manufacturing a semiconductor device according to an embodiment includes: forming a mask material on a surface of a semiconductor substrate; bringing the semiconductor substrate having the mask material formed thereon into a dry etching device; and forming a trench at an exposed portion of the semiconductor substrate by performing a first etching process with the mask material serving as an etching mask in the dry etching device. In the forming of the trench, a mixed gas of a fluorine-based gas containing fluorine atoms, a hydrogen bromide gas (HBr), and a chlorine gas ($Cl_2$) is used as a first etching gas. The first etching process includes a main etching process performed under the condition that a flow rate ratio is more than 0 and less than 0.04, the flow rate ratio being a value obtained by dividing a flow rate NF by a flow rate TF, the flow rate NF being a flow rate obtained by dividing a flow rate of the fluorine-based gas by the number of fluorine atoms bonded to one molecule of the fluorine-based gas, the flow rate TF being a total flow rate of the hydrogen bromide gas (HBr) and the chlorine gas ($Cl_2$).

According to a semiconductor device in one embodiment, the amount of reaction product to accumulate in a dry etching device can be reduced.

Other problems and novel features will be apparent from the description herein and the accompanying drawings.

BRIEF DESCRIPTION OF THE DRAWINGS

FIG. 5 is a cross-sectional view showing a step in an etching process by the etching device in the embodiment.

FIG. 6 is a cross-sectional view showing a step in the etching process by the etching device after the step of FIG. 5 in the embodiment.

FIG. 7 is a cross-sectional view showing a step after the step of FIG. 6 in the embodiment.

FIG. 8 is a cross-sectional view showing a step after the step of FIG. 7 in the embodiment.

DESCRIPTION OF THE PREFERRED EMBODIMENTS

Figure 1:
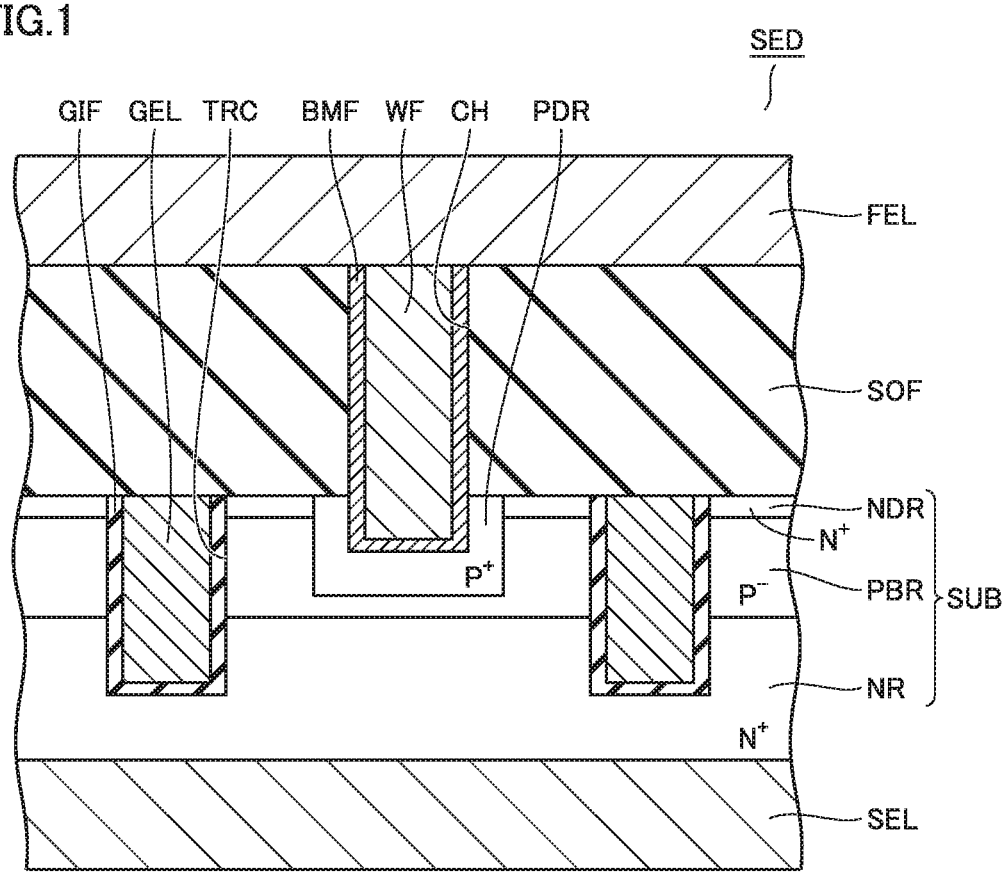
FIG. 1 is a cross-sectional view of a semiconductor device manufactured in a method for manufacturing a semiconductor device according to an embodiment.

First, an example semiconductor device including a trench-gate N channel type MOSFET will be described. As shown in FIG. 1, in a semiconductor device SED, an $N^+$-type source region NDR is formed to extend from a surface of a semiconductor substrate SUB to a predetermined depth. A $P^-$ base region PBR is formed to extend from the bottom of $N^+$-type source region NDR to a predetermined depth. An N type region NR of semiconductor substrate SUB is located to extend from the bottom of $P^-$ base region PBR to the other surface of semiconductor substrate SUB. In a trench TRC extending from a surface of semiconductor substrate SUB to N type region NR, a gate electrode GEL is formed with a gate oxide film GIF intervening.

A silicon oxide film SOF is formed so as to cover semiconductor substrate SUB. A tungsten plug WF is formed to extend through silicon oxide film SOF. Tungsten plug WF is formed in a contact hole CH with a barrier metal BMF intervening. Tungsten plug WF is electrically connected to $N^+$-type source region NDR and $P^-$ base region PBR with a $P^+$-type region intervening.

On a surface of silicon oxide film SOF, an upper electrode FEL electrically connected to tungsten plug WF is formed. On the other surface of semiconductor substrate SUB, a lower electrode SEL is formed. Semiconductor device SED including an N channel type MOSFET is configured as described above.

Next, an example method for manufacturing the above-described semiconductor device will be described. First, a silicon oxide film HMF to serve as a hard mask is formed so as to cover a surface of semiconductor substrate SUB (see FIG. 2). Then, a predetermined photolithography process is performed to form a photoresist pattern PRP corresponding to a trench pattern (see FIG. 2).

Figure 2:
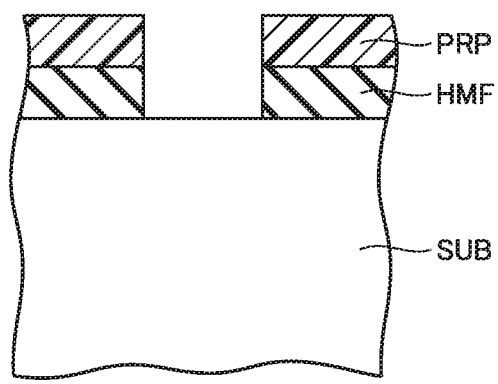
FIG. 2 is a cross-sectional view showing one step in the method for manufacturing a semiconductor device in the embodiment.

Then, as shown in FIG. 2, an etching process is performed on silicon oxide film HMF with the photoresist pattern serving as an etching mask, so as to form a pattern of silicon oxide film HMF that serves as a hard mask for forming a trench. Then, a trench is formed by an etching device in semiconductor substrate SUB (wafer) having the hard mask (pattern of silicon oxide film HMF) formed thereon.

Figure 3:
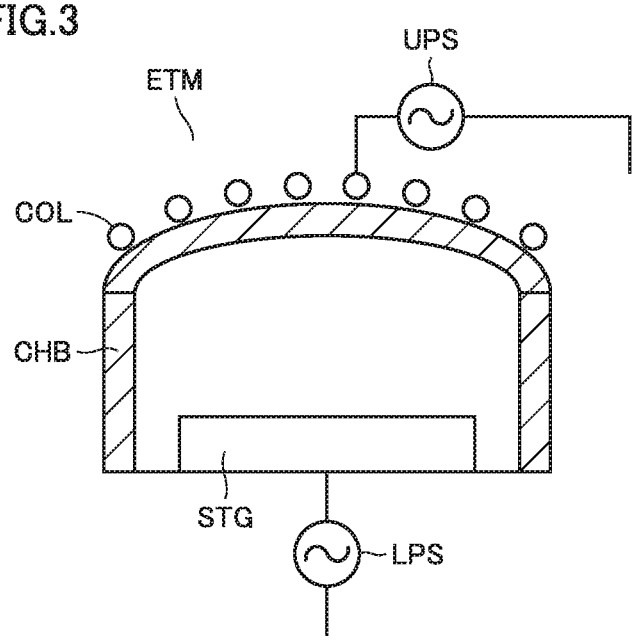
FIG. 3 is a cross-sectional view showing an etching device to be used for dry etching in the embodiment.

FIG. 3 shows a dry etching device of an ICP (inductively coupled plasma) type as an example etching device. As shown in FIG. 3, in an ICP-type dry etching device ETM, an ICP coil COL is disposed at the top of a chamber CHB. To ICP coil COL, an upper RF (radio frequency) power supply UPS is electrically connected.

In chamber CHB, a stage STG on which a wafer WAF (semiconductor substrate SUB) is to be placed is disposed. To stage STG, a lower RF power supply LPS is electrically connected. An etching gas is introduced into chamber CHB, and RF power is supplied to ICP coil COL with upper RF power supply UPS, so that plasma is generated. RF power is applied to stage STG with lower RF power supply LPS, and ions generated in the plasma are attracted to the semiconductor substrate. An etching process is thus performed.

Figure 4:
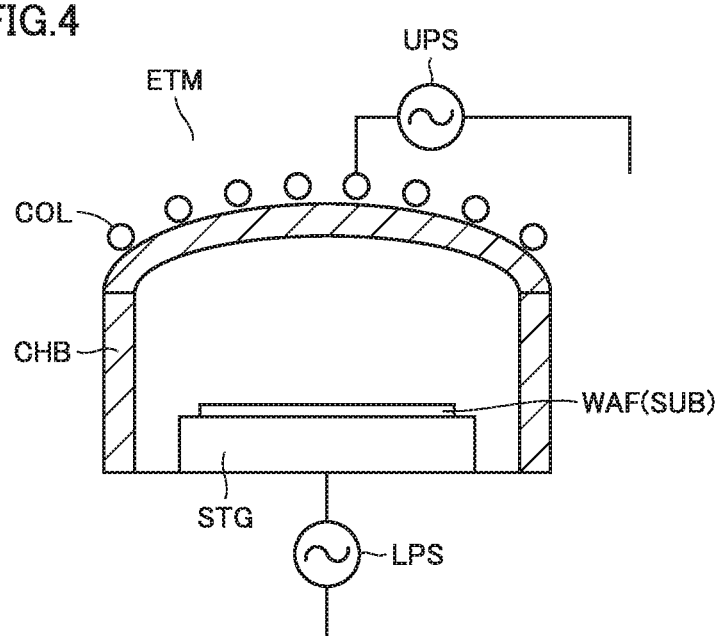
FIG. 4 is a cross-sectional view showing a state where a semiconductor substrate has been brought into the etching device in the embodiment.

As shown in FIG. 4, semiconductor substrate SUB (wafer) having a hard mask (pattern of silicon oxide film HMF) formed thereon is carried into chamber CHB and is placed on stage STG. Then, as shown in FIG. 5, a natural oxidation film NOF located on a surface of semiconductor substrate SUB exposed at the bottom of an opening in silicon oxide film HMF (hard mask) is removed.

The pressure in chamber CHB is set to, for example, 4 mTorr (0.533 Pa). The power of upper RF power supply UPS is set to, for example, 400 W. The power of lower RF power supply LPS is set to, for example, 50 W. As an etching gas, tetrafluoromethane ($CF_4$) is introduced into chamber CHB. The flow rate of tetrafluoromethane ($CF_4$) is set to, for example, 50 sccm (50 cm$^3$/min). An etching process is performed under these conditions to remove the exposed natural oxidation film NOF (breakthrough).

Subsequently, substantial etching of semiconductor substrate SUB is performed. The pressure in chamber CHB is set to, for example, 7 mTorr (0.933 Pa). The power of upper RF power supply UPS is set to, for example, 500 W. The power of lower RF power supply LPS is set to, for example, 225 W. As an etching gas, tetrafluoromethane ($CF_4$), hydrogen bromide (HBr), chlorine ($Cl_2$), and oxygen ($O_2$) are introduced into chamber CHB.

The flow rate of tetrafluoromethane ($CF_4$) is set to, for example, 8 sccm (8 cm$^3$/min). The flow rate of hydrogen bromide (HBr) is set to, for example, 60 sccm (60 cm$^3$/min). The flow rate of chlorine ($Cl_2$) is set to, for example, 20 sccm (20 cm$^3$/min). The flow rate of oxygen ($O_2$) is set to, for example, 8 sccm (8 cm$^3$/min). As shown in FIG. 6, an etching process is performed on semiconductor substrate SUB (silicon) under these conditions for a predetermined time to form trench TRC having a predetermined depth. After that, silicon oxide film HMF is removed. Trench TRC has a depth of about 2.0 μm to 3.0 μm and has a width of about 0.3 μm to 0.7 μm.

Then, as shown in FIG. 7, gate oxide film GIF is formed on, for example, the sidewall surface of trench TRC by, for example, a thermal oxidation process. Then, as shown in FIG. 8, a polysilicon film PSF is formed so as to be embedded in trench TRC by, for example, CVD. The deposited polysilicon film PSF has a thickness of about 0.2 μm to 0.4 μm.

Then a portion of polysilicon film PSF and other films located on the upper surface of semiconductor substrate SUB is removed by a dry etching device. First, as a main etching process, the pressure in chamber CHB is set to, for example, 4 mTorr (0.533 Pa). The power of upper RF power supply UPS is set to, for example, 550 W. The power of lower RF power supply LPS is set to, for example, 50 W. As an etching gas, hydrogen bromide (HBr) and chlorine ($Cl_2$) are introduced into chamber CHB. The flow rate of hydrogen bromide (HBr) is set to, for example, 120 sccm (120 cm$^3$/min). The flow rate of chlorine ($Cl_2$) is set to, for example, 20 sccm (20 cm$^3$/min).

The flow rate of tetrafluoromethane ($CF_4$) introduced for etching polysilicon film PSF is made lower than that for etching semiconductor substrate SUB described above. More preferably, a fluorine-based gas is not used in this dry etching process. As described later, it is preferable to introduce a certain amount of tetrafluoromethane ($CF_4$) for forming trench TRC for the purpose of reducing the amount of side etch of the sidewall of trench TRC and shortening the cleaning time for the chamber. However, since the film thickness of polysilicon film PSF is much smaller than the film thickness corresponding to the depth of trench TRC, little problem of, for example, side etch arises in etching polysilicon film PSF. Further, it is preferable to reduce the flow rate of fluorine-based gas, such as tetrafluoromethane ($CF_4$), from a standpoint of ensuring high selectivity of polysilicon film PSF and underlying gate oxide film GIF.

Then, as an over etching process, the pressure in chamber CHB is set to, for example, 65 mTorr (0.867 Pa). The power of upper RF power supply UPS is set to, for example, 825 W. The power of lower RF power supply LPS is set to, for example, 120 W. As an etching gas, hydrogen bromide (HBr) and oxygen ($O_2$) are introduced into chamber CHB. The flow rate of hydrogen bromide (HBr) is set to, for example, 60 sccm (60 cm$^3$/min). The flow rate of oxygen ($O_2$) is set to, for example, 8 sccm (8 cm$^3$/min).

Figure 9:
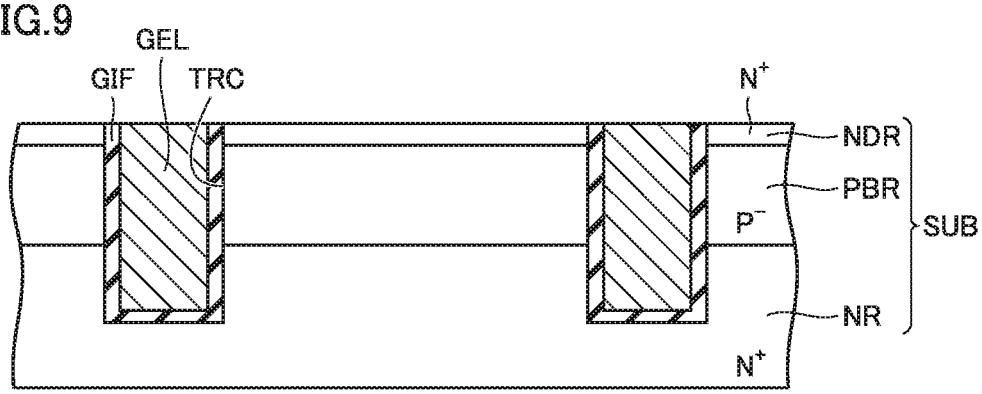
FIG. 9 is a cross-sectional view showing a step after the step of FIG. 8 in the embodiment.

By performing a dry etching process under such conditions, a portion of polysilicon film PSF and other films located on the upper surface of semiconductor substrate SUB is removed. Thus, as shown in FIG. 9, a portion of polysilicon film PSF left unremoved in trench TRC forms gate electrode GEL. At this time, an impurity of a predetermined conductivity type that was implanted in advance in N type semiconductor substrate SUB diffuses to form $N^+$ source region NDR and $P^-$ base region PBR.

Figure 10:
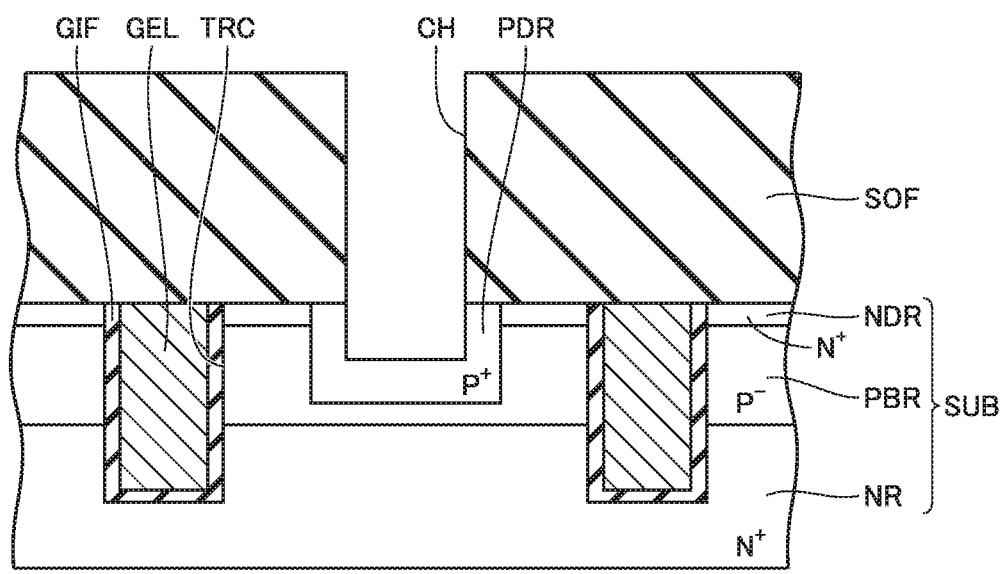
FIG. 10 is a cross-sectional view showing a step after the step of FIG. 9 in the embodiment.

Then, as shown in FIG. 10, for example, silicon oxide film SOF is formed by CVD so as to cover semiconductor substrate SUB. Then, predetermined photolithography and etching processes are performed to form contact hole CH extending through silicon oxide film SOF. Then, an ion implantation process is performed to form a $P^+$ region PDR at the bottom of contact hole CH.

Then, a barrier metal (not shown) is formed on silicon oxide film SOF so as to cover the inner wall surface of contact hole CH. Then, for example, a tungsten film (not shown) is formed on silicon oxide film SOF so as to be embedded in contact hole CH.

Figure 11:
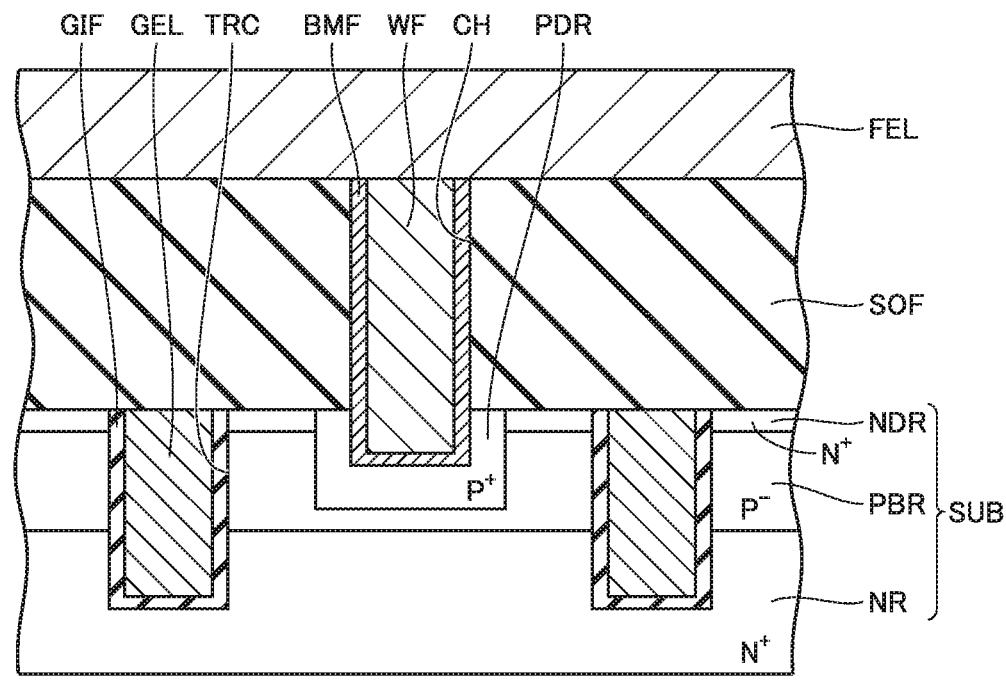
FIG. 11 is a cross-sectional view showing a step after the step of FIG. 10 in the embodiment.

Then, for example, a chemical mechanical polishing process is performed, so that, as shown in FIG. 11, a portion of the barrier metal and a portion of the tungsten film located on the upper surface of silicon oxide film SOF are removed while a portion of barrier metal BMF and a portion of the tungsten film located in contact hole CH are left unremoved. In this way, tungsten plug WF is formed in contact hole CH with barrier metal BMF intervening.

Then, upper electrode FEL is formed to be electrically connected to tungsten plug WF. Then, lower electrode SEL is formed to be in contact with N type region NR of semiconductor substrate SUB. A main part of semiconductor device SED shown in FIG. 1 is thus completed.

The above-described method for manufacturing a semiconductor device can prevent a reaction product from adhering to the inside of dry etching device ETM by using, as an etching gas, a gas containing a fluorine-based gas containing fluorine atoms for forming trench TRC in semiconductor substrate SUB. Explanation for this will be given based on comparison with a method for manufacturing a semiconductor device according to a comparative example.

Figure 12:
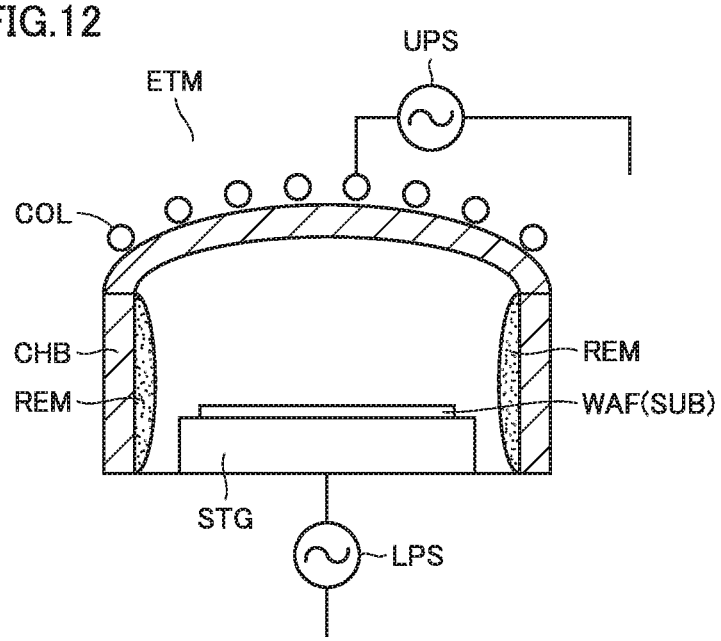
FIG. 12 is a cross-sectional view showing a state in an etching device under a method for manufacturing a semiconductor device according to a comparative example.

A semiconductor device according to a comparative example uses chlorine ($Cl_2$) and hydrogen bromide (HBr) as an etching gas for forming trench TRC in semiconductor substrate SUB (silicon). As a reaction product accompanying an etching process of semiconductor substrate SUB, a silicon chloride and a silicon bromide are generated. In this case, as shown in FIG. 12, the generated reaction product REM tends to easily adhere to the inner wall surface of chamber CHB of dry etching device ETM.

When reaction product REM gradually accumulates on the inner wall surface of chamber CHB, reaction product REM easily comes off from the inner wall surface of chamber CHB. Reaction product REM that has come off may fall onto semiconductor substrate SUB. When a dry etching process is performed while reaction product REM is on semiconductor substrate SUB, it may not be possible to form a desired pattern, which may be one of the causes of reduction in yield of semiconductor device.

Further, accumulation of reaction product REM on the inner wall surface of chamber CHB may cause changes in etching conditions, such as an etching rate. Accordingly, it may not be possible to form a pattern with desired dimensions.

As an etching gas for forming trench TRC in semiconductor substrate SUB (silicon), a method for manufacturing a semiconductor device according to the comparative example does not use a fluorine-based gas, whereas a method for manufacturing a semiconductor device according to the embodiment uses an etching gas containing a fluorine-based gas.

Using an etching gas containing a fluorine-based gas causes generation of a silicon fluoride, which is lower in freezing point, as a reaction product. The silicon fluoride can be discharged as a gas to the outside of chamber CHB. Therefore, the amount of reaction product adhering to and accumulating on, for example, the inner wall of chamber CHB can be reduced.

Figure 13:
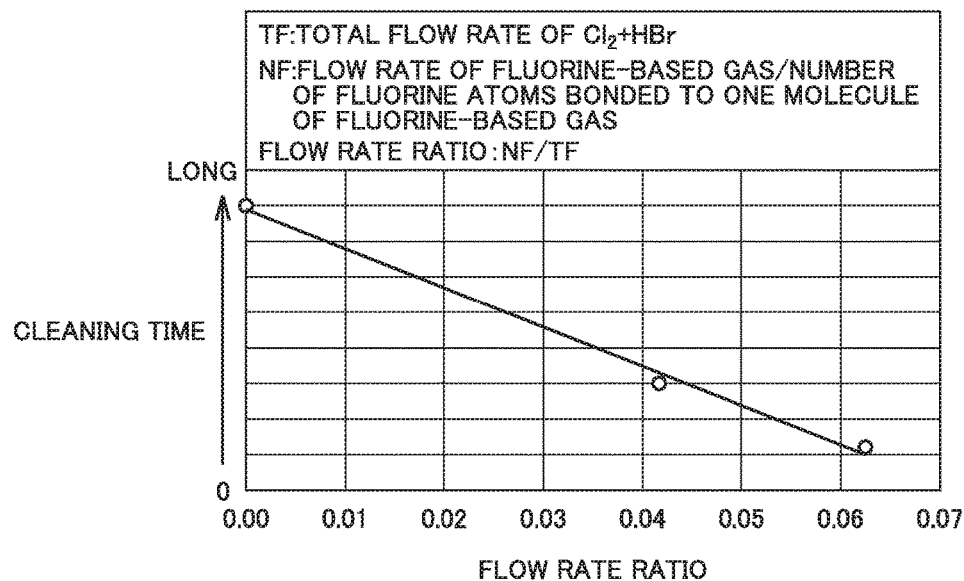
FIG. 13 is a graph showing the relationship between the flow rate ratio between a fluorine-based gas and an etching gas other than a fluorine-based gas, and the cleaning time for reaction product adhering to the inside of a chamber in the embodiment.

The inventor evaluated the relationship between the flow rate of a fluorine-based gas contained in an etching gas, and the amount of reaction product. A resulting graph is shown in FIG. 13. A total flow rate of chlorine ($Cl_2$) and hydrogen bromide (HBr) is referred to as a flow rate TF. A flow rate obtained by dividing a flow rate of fluorine-based gas by the number of fluorine atoms bonded to one molecule of fluorine-based gas is referred to as a flow rate NF. A value obtained by dividing flow rate NF by flow rate TF is referred to as a flow rate ratio. The horizontal axis of the graph represents flow rate ratio. For example, when the flow rate of tetrafluoromethane ($CF_4$) is 8 sccm (8 cm$^3$/min), flow rate NF is 2 sccm (2 cm$^3$/min).

On the other hand, the vertical axis of the graph represents time required to remove (clean) a reaction product adhering to the inside of chamber CHB. A longer cleaning time indicates a larger amount of reaction product.

As shown in FIG. 13, it was found that the cleaning time is made shorter in the case of using an etching gas containing a fluorine-based gas than in the case of not using a fluorine-based gas as an etching gas (i.e., in the case of 0 for the horizontal axis). Further, is was found that, as the flow rate of fluorine-based gas becomes higher, the cleaning time becomes shorter and the amount of reaction product adhering to and accumulating on, for example, the inner wall surface of chamber CHB becomes smaller.

Figure 14:
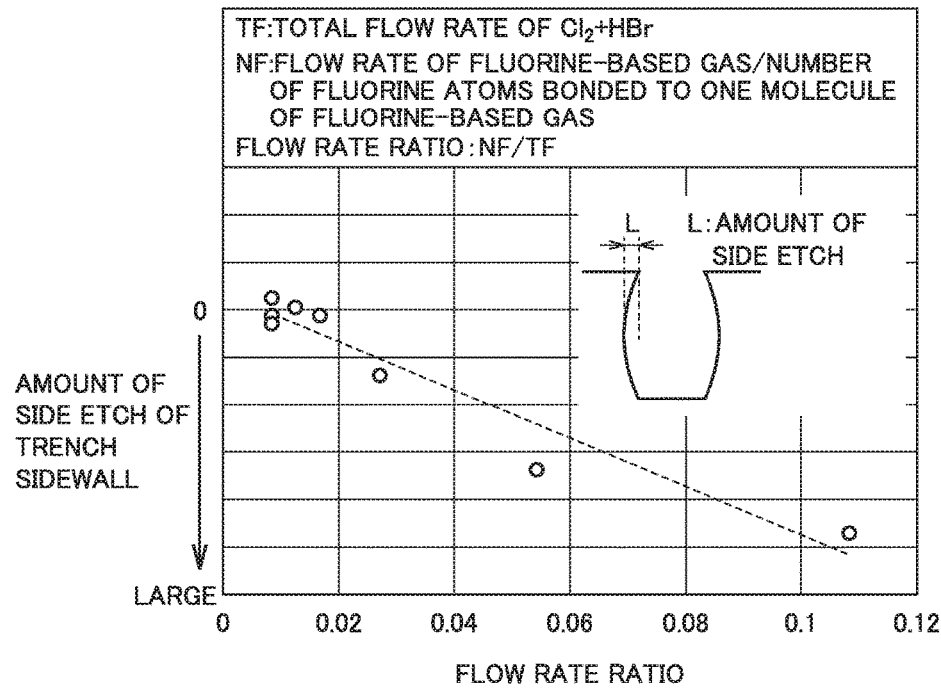
FIG. 14 is a graph showing the relationship between the flow rate ratio between a fluorine-based gas and an etching gas other than a fluorine-based gas, and the amount of side etch of trench sidewall in the embodiment.

The inventor also recognized that an increase in flow rate of fluorine-based gas causes a phenomenon where the sidewall of trench TRC is etched. A resulting graph is shown in FIG. 14. The horizontal axis represents flow rate ratio described above. The vertical axis represents amount L of side etch of the sidewall of trench TRC.

As shown in FIG. 14, it is seen that the amount of side etch of the sidewall of trench TRC increases with an increase in flow rate of fluorine-based gas. When the amount of side etch of the sidewall of trench TRC increases, trench TRC cannot be filled with a polysilicon film reliably in forming gate electrode GEL. Accordingly, a desired gate electrode GEL cannot be formed.

From these results, a higher flow rate of fluorine-based gas is preferable from a standpoint of reducing the amount of reaction product adhering to and accumulating on, for example, the inner wall surface of chamber CHB. On the other hand, a lower flow rate of fluorine-based gas is preferable from a standpoint of reducing the amount of side etch to form a desired gate electrode GEL.

In order to reduce the amount of reaction product adhering to and accumulating on, for example, the inner wall surface of chamber CHB, as well as reduce the amount of side etch of trench TRC, the inventor found that a desirable flow rate ratio regarding a fluorine-based gas is more than 0 and less than 0.04. The inventor found that, in order to further reduce the amount of reaction product and to reduce the amount of side etch of trench TRC to a tolerable amount, a more desirable flow rate ratio is more than 0.005 and less than 0.035. The inventor found that, in order to still further reduce the amount of reaction product and to reduce the amount of side etch of trench TRC to a tolerable amount, a still more desirable flow rate ratio is more than 0.015 and less than 0.035.

In the above-described method for manufacturing a semiconductor device, tetrafluoromethane ($CF_4$) is used as a fluorine-based gas as an example. A fluorine-based gas, however, is not limited to this but another fluorine-based gas, such as, for example, trifluoromethane ($CHF_3$), sulfur hexafluoride ($SF_6$), and nitrogen trifluoride ($NF_3$) may be used.

Further, the above-described method for manufacturing a semiconductor device is not limited to a case where trench TRC is formed to have gate electrode GEL. For example, the method may also be applied to a case where a trench is formed to have an element isolation region.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a semiconductor device, the method comprising:
   forming a mask material on a surface of a semiconductor substrate;
   bringing the semiconductor substrate having the mask material formed thereon into a dry etching device; and
   forming a trench at an exposed portion of the semiconductor substrate by performing a first etching process with the mask material serving as an etching mask in the dry etching device;
   in the forming of the trench, a mixed gas of a fluorine-based gas containing fluorine atoms, a hydrogen bromide gas (HBr), and a chlorine gas ($Cl_2$) being used as a first etching gas,
   the first etching process including a main etching process performed under a condition that a flow rate ratio is more than 0 and less than 0.04, the flow rate ratio being a value obtained by dividing a flow rate NF by a flow rate TF, the flow rate NF being a flow rate obtained by dividing a flow rate of the fluorine-based gas by the number of the fluorine atoms bonded to one molecule of the fluorine-based gas, the flow rate TF being a total flow rate of the hydrogen bromide gas (HBr) and the chlorine gas ($Cl_2$).

2. The method for manufacturing a semiconductor device according to claim 1, wherein the main etching process is performed under a condition that the flow rate ratio is more than 0.005 and less than 0.035.

3. The method for manufacturing a semiconductor device according to claim 2, wherein the main etching process is performed under a condition that the flow rate ratio is more than 0.015 and less than 0.035.

4. The method for manufacturing a semiconductor device according to claim 1, wherein, in the forming of the trench, the first etching process includes a pre-etching process to remove a natural oxidation film located on a surface of the semiconductor substrate before the main etching process.

5. The method for manufacturing a semiconductor device according to claim 4, wherein, in the pre-etching process, another fluorine-based gas is used as a second etching gas.

6. The method for manufacturing a semiconductor device according to claim 1, the method further comprising:
   after forming the trench,
   forming a conductive film so as to cover the semiconductor substrate in such a manner as to be embedded in the trench with an insulating film intervening in the trench; and
   forming an electrode in the trench by performing a second etching process on the conductive film to remove the conductive film formed outside the trench while leaving the conductive film in the trench unremoved, wherein
   in the forming of the electrode in the trench, the second etching process includes a first etching step performed by using a third etching gas having a flow rate of a fluorine-based gas lower than the flow rate of the fluorine-based gas contained in the first etching gas.

7. The method for manufacturing a semiconductor device according to claim 6, wherein a film thickness of the conductive film in the forming of the conductive film is smaller than a film thickness corresponding to a depth of the trench.

8. The method for manufacturing a semiconductor device according to claim 7, wherein the third etching gas contains no fluorine-based gas.

9. The method for manufacturing a semiconductor device according to claim 8, wherein, in the first etching step, a mixed gas containing another chlorine ($Cl_2$) and another hydrogen bromide (HBr) is used as the third etching gas.

10. The method for manufacturing a semiconductor device according to claim 8, wherein, in the forming of the electrode in the trench, the second etching process includes a second etching step to perform over etching after the first etching step.

11. The method for manufacturing a semiconductor device according to claim 10, wherein, in the second etching step, another mixed gas containing oxygen ($O_2$) and still another hydrogen bromide (HBr) is used as a fourth etching gas.

* * * * *